United States Patent
Yamaguchi

[11] Patent Number: 5,239,215
[45] Date of Patent: Aug. 24, 1993

[54] LARGE SCALE INTEGRATED CIRCUIT CONFIGURED TO ELIMINATE CLOCK SIGNAL SKEW EFFECTS

[75] Inventor: Seiji Yamaguchi, Osaka, Japan

[73] Assignee: Matsushita Electric Industrial Co., Ltd., Osaka, Japan

[21] Appl. No.: 980,413

[22] Filed: Nov. 20, 1992

Related U.S. Application Data
[62] Division of Ser. No. 351,221, May 15, 1989.

[30] Foreign Application Priority Data
May 16, 1988 [JP] Japan ................ 63-118521

[51] Int. Cl.⁵ ............................... H03K 19/003
[52] U.S. Cl. ................... 307/480; 307/443; 307/479; 307/482.1
[58] Field of Search ........... 307/443, 479, 480–481, 307/262, 269, 482.1

[56] References Cited
U.S. PATENT DOCUMENTS
| | | | |
|---|---|---|---|
| 4,812,684 | 3/1984 | Yamagiwa et al. | 307/480 |
| 4,839,604 | 6/1989 | Tanahashi | 307/480 X |
| 4,866,310 | 9/1989 | Ando et al. | 307/443 X |
| 4,975,593 | 12/1990 | Kurakazu et al. | 307/269 |
| 5,013,942 | 5/1991 | Nishimura et al. | 307/443 X |

*Primary Examiner*—David R. Hudspeth
*Attorney, Agent, or Firm*—Lowe, Price, LeBlanc & Becker

[57] ABSTRACT

An integrated circuit has a clock signal supply circuit positioned in a central region of the IC chip, for supplying a clock signal to each of a plurality of outer regions of the integrated circuit disposed around the central region, for thereby substantially eliminating clock signal skew effects. The clock signal may be distributed directly to circuit elements within the respective outer regions, or transferred to these circuit elements via respective buffer circuits which are formed at the centers of these regions.

15 Claims, 4 Drawing Sheets

LARGE SCALE INTEGRATED CIRCUIT CONFIGURED TO ELIMINATE CLOCK SIGNAL SKEW EFFECTS

This application is a division of application Ser. No. 07/351,221 filed May 15, 1989 pending as of Feb. 11, 1993.

BACKGROUND OF THE INVENTION

The present invention relates to semiconductor integrated circuits, and in particular to very large scale semiconductor integrated circuits (referred to in the following as VLSIs) which have a large chip size and which utilize a high clock signal frequency in order to enhance processing operations of a microprocessor etc.

As semiconductor technology has advanced in recent years, the number of elements and the chip size of large semiconductor integrated circuits have continually increased. This is especially true in the case of VLSIs which include a microprocessor and a built-in cache memory. Furthermore as a result of improvements in device technology, the operating speeds of circuit elements, such as logic elements, have increased. Hence, the frequency of the clock signal used in operation of such circuit elements has also increased in recent years. Such an increase in the clock signal frequency enables the processing capability of a microprocessor to be enhanced. However problems arise in the design of a VLSI having a microprocessor and a cache memory, when a high frequency of clock signal is used, i.e. problems arise relating to timing deviations of the clock signal in different regions of the semiconductor integrated circuit. These deviations result from variations in the path lengths over which the clock signal is supplied to various regions of the integrated circuit, with these path lengths depending upon the respective positions of various circuit elements. Variations in clock signal phase throughout the integrated circuit thereby arise, such variations generally being referred to as a skew of the clock signal supplied to different elements. If for example a logic circuit within an integrated circuit produces output data at a certain time point, and the data are to be received simultaneously by two other logic circuits, then if there is clock skew it is possible that one circuit will receive the data at the appropriate time but that the other circuit may receive incorrect data at that time. This problem of clock skew is particularly serious in the case of a VLSI, due to the large chip size, so that errors in logic circuit operation can readily arise.

In the prior art, a clock signal supply circuit is generally positioned near the outer periphery of an integrated circuit chip (where the term "clock signal supply circuit" as used herein designates a circuit which produces a clock signal that is then supplied to various regions of an integrated circuit). If this is done, and if for example the clock signal supply circuit is positioned near the right-side edge of the integrated circuit chip, then the larger is the size of the chip, the greater will become the deviations in connecting lead capacitance and connecting lead resistance of the connecting leads that supply the clock signal to circuit elements at the right and left-hand sides of the integrated circuit chip. Differences in the amount of delay of the clock signal supplied to these elements in different positions on the chip will thereby arise, i.e. clock signal phase deviations (clock skew) will occur. Furthermore if a 2-phase non-overlap clock signal is used, then it is necessary to ensure that the non-overlap period of that clock signal is maintained. However if the maximum value of the clock skew of the clock signal supplied to respectively different logic circuits becomes greater than this non-overlap period, then operating errors will occur.

SUMMARY OF THE INVENTION

It is an objective of the present invention to overcome the problems of the prior art described above, by providing a semiconductor integrated circuit whereby an amount of clock signal skew in the integrated circuit, arising between clock signals that are supplied to different logic circuits within the integrated circuit, can be made substantially smaller than has been possible in the prior art. Operating errors arising from clock phase deviations can thereby be substantially eliminated, even in the case of a semiconductor integrated circuit having a very large size of chip, which employs a high frequency of clock signal.

To achieve the above objective, a semiconductor integrated circuit according to one embodiment of the present invention comprises clock signal supply means for producing a clock signal and a plurality of logic circuit sections coupled to receive the clock signal from the clock signal supply means, the clock signal supply means being positioned substantially in a central region of the integrated circuit chip and the logic circuit sections disposed in respective outer regions positioned peripherally outward from the central region, with the semiconductor integrated circuit comprising respective connecting lead means for supplying the clock signal from the clock signal supply means to at least a part of the plurality of logic circuit sections.

A semiconductor integrated circuit according to another embodiment of the invention further comprises respective clock buffer means disposed substantially centrally in each of the outer regions, each of the outer regions comprising connecting lead means for supplying an output clock signal produced from the corresponding clock buffer to circuit elements of the logic circuit section of that outer region.

Due to the above configuration for a semiconductor integrated circuit according to the present invention, the connecting lead capacitance and connecting lead resistance of the supply paths of the clock signal produced from the clock signal supply means are minimized, while in addition, phase deviations between the clock signals supplied to various different regions of the integrated circuit are minimized.

DESCRIPTION OF PREFERRED EMBODIMENTS

Figure 1A:
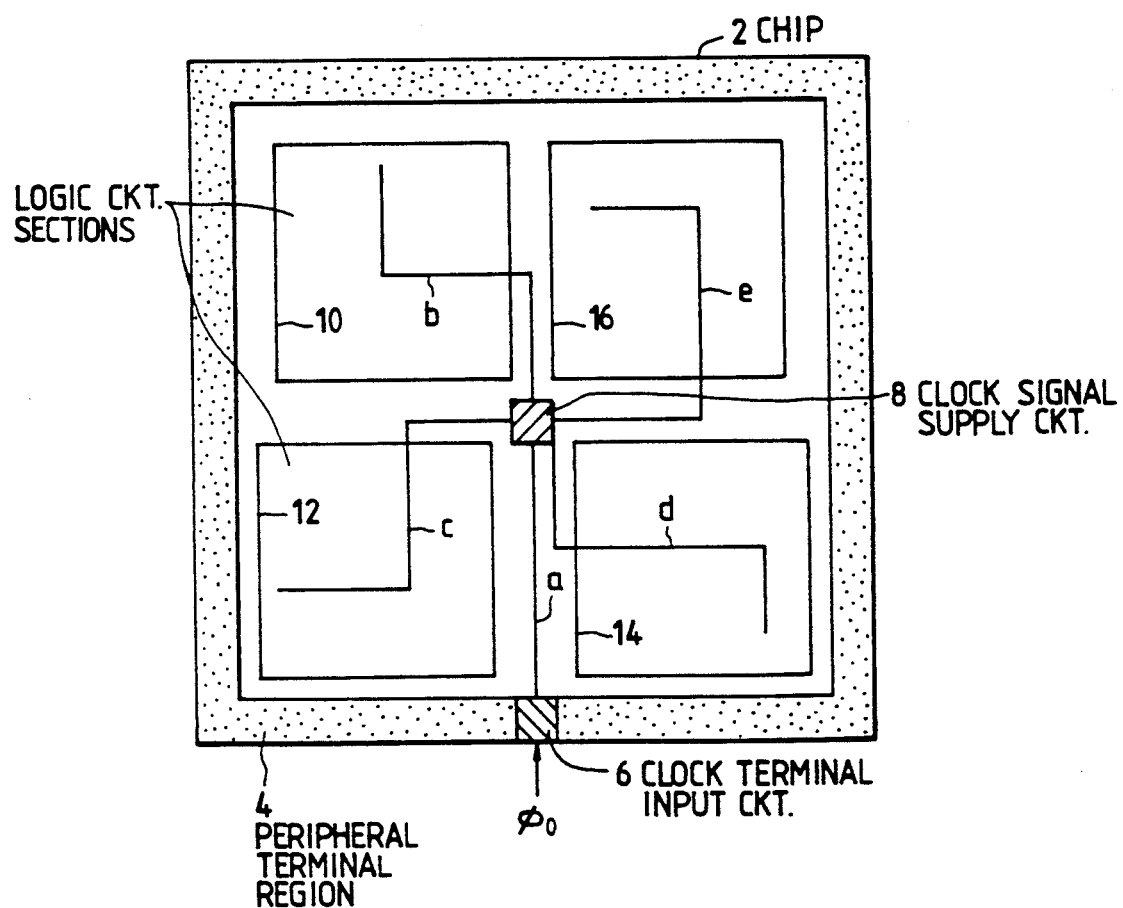
FIG. 1A is a block diagram of a first embodiment of a semiconductor integrated circuit according to the present invention.

Embodiments of the invention will be described referring first to FIG. 1A, which is a block diagram of a first embodiment of a semiconductor integrated circuit according to the present invention, and which also shows the respective positions of various circuit blocks of the integrated circuit on the integrated circuit chip. Numeral 2 denotes the integrated circuit chip, numeral 4 denotes a peripheral region of the chip in which are formed terminals for connecting the integrated circuit to other apparatus, and numeral 6 denotes a clock buffer circuit which receives an externally supplied clock signal $\phi_0$, and produces an output clock signal $\phi_1$ that is applied via a connecting lead a to a clock signal supply circuit 8. The clock signal supply circuit 8 is positioned in a central region of the chip 2 (as viewed in plan). Blocks 10, 12, 14 and 16 denote respective logic circuit sections which are disposed in respective regions of the chip 2 which are positioned peripherally outward from the central region containing the clock signal supply circuit 8. The term "logic circuit section" is used herein in a very general sense, to signify such basically separate sections of a large-scale integrated circuit as a cache memory, etc. In response to the clock signal $\phi_1$, the clock signal supply circuit 8 produces an output clock signal from each of four outputs thereof, which is supplied over connecting leads b, c, d and e to respective ones of the logic circuit sections 10, 12, 14 and 16.

Figure 1B:
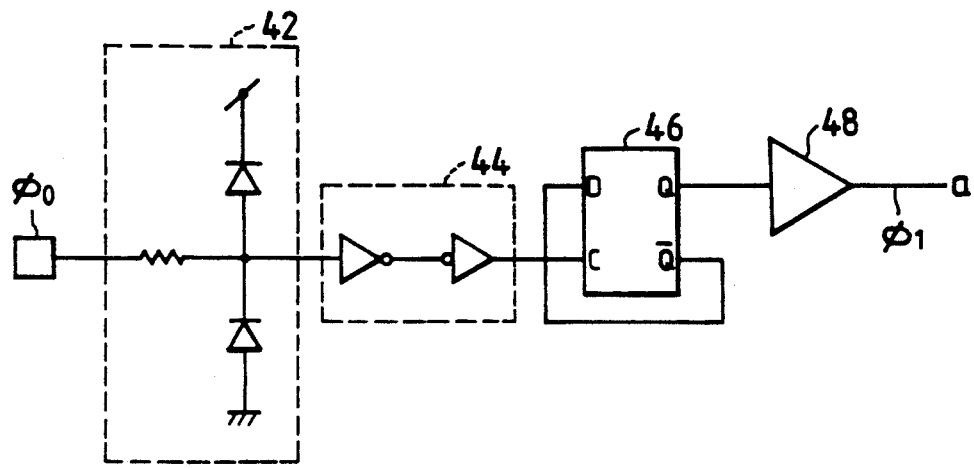
FIG. 1B is a circuit diagram of a clock terminal input circuit in the embodiment of FIG. 1A.

FIG. 1B is a circuit diagram of a specific configuration for the clock terminal input circuit 6, which executes frequency division of the externally supplied clock signal $\phi_0$ by $\frac{1}{2}$. The clock signal $\phi_0$ is applied to a terminal pad 40, and thence through an input protection circuit 42 and then through a buffer circuit 44 (in which waveform shaping is executed) to be applied to the clock input terminal C of a D-type flip-flop 46. The NQ output from the D-type flip-flop 46 is connected to the data input terminal D of the flip-flop, so that frequency division of the signal applied to the C terminal by $\frac{1}{2}$ is executed, with the frequency-divided output clock signal $\phi_1$ appearing from the Q output terminal of FF 46. The clock signal $\phi_1$ is then transferred through a buffer 48, to be supplied to the connecting lead a.

Figure 1C:
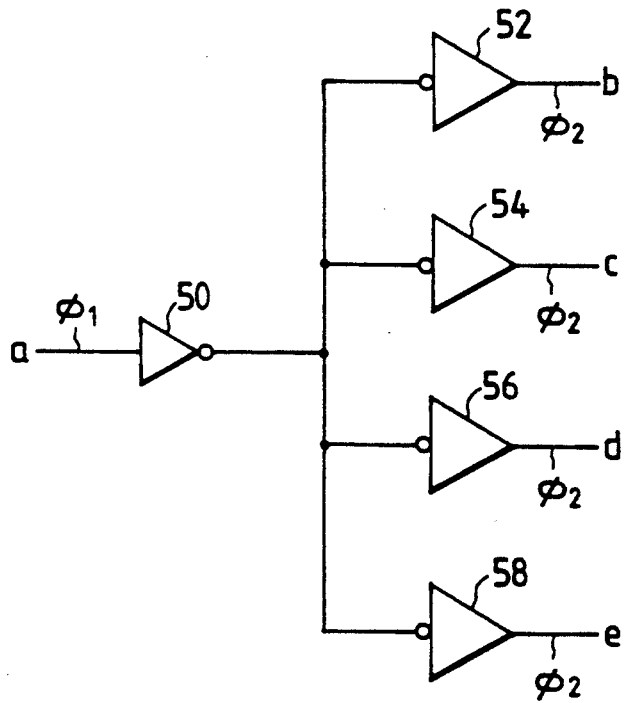
FIG. 1C is a circuit diagram of a clock signal supply circuit in the embodiment of FIG. 1A.

The clock signal supply circuit 8 executes waveform shaping and buffering of this clock signal $\phi_1$, to produce a clock signal $\phi_2$ from each of four outputs, as mentioned above. FIG. 1C is a circuit diagram of a specific configuration for the clock signal supply circuit 8. The clock signal $\phi_1$ is passed through an inverter 50, and the resultant output signal from the inverter 50 is transferred through each of inverter buffers 52, 54, 56 and 58, each of which thus produces the clock signal $\phi_2$. The drive power capacity required for each of the inverter buffers 52 to 58 is determined in accordance with the respective values of capacitance of the connecting leads b, c, d and e which receive the respective output signals from the inverter buffers.

With such a configuration for clock signal distribution in a semiconductor integrated circuit, the maximum amount of clock skew will occur between a portion of a logic circuit section that is positioned close to the center of the chip 2 and a portion that is positioned near the periphery of the chip. That is to say, the rising edge of each clock signal pulse will occur earlier, for a position which is near the center of the chip 2, then will be the case for a position which is near the chip periphery.

Thus, it can be understood that, for positions lying along a set of concentric circles which are coaxial with the center of the chip (as viewed in FIG. 1A), the phase of the clock signal $\phi_2$ will be uniform for all positions along any one specific circle, and the phase delay (with respect to the output signal from each of inverter buffers 52 to 58) will increase in accordance with the distance of each circle from the chip center. As a result, almost no degree of clock skew will arise between the four regions of the chip 2 that are occupied by the logic circuit sections 10 to 16. More specifically, although some degree of clock phase difference will arise between a position near the center of the chip 2 and a position near the chip periphery, this can be made less than approximately $\frac{1}{2}$ of the maximum value of clock skew that arises with a prior art semiconductor integrated circuit configuration in which the clock signal supply circuit is positioned near the periphery of the integrated circuit chip.

Although the above embodiment has been described for the case in which there are four logic circuit sections, which receive a clock signal from respective ones of four outputs of the clock signal supply circuit, i.e. with each clock signal output of the clock signal supply circuit being directly coupled by a connecting lead to a corresponding one of the logic circuit sections, the invention is not limited to such an arrangement. That is to say, the above embodiment assumes that the respective internal configurations of the logic circuit sections 10 to 16 are such that mutually identical values of connecting lead capacitance are presented to the clock signal supply circuit 8 by each of the connecting leads b to e. However in some cases it may be preferable to drive two or more mutually adjacent logic circuit sections from a single clock signal output of the clock signal supply circuit, using a common connecting lead extending from the clock signal supply circuit, in order to ensure that substantially equal values of total load capacitance are driven by each output of the clock signal supply circuit. Conversely it may be preferable to drive a single logic circuit section from a plurality of clock signal outputs of the clock signal supply circuit, supplied over a plurality of connecting leads. This can be done, so long as it is ensured that substantially equal values of total load capacitance are driven by each output of the clock signal supply circuit. Thus in general, designating the number of logic circuit section as m and the number of outputs from the clock signal supply circuit as n, the invention can be applied to a semiconductor integrated circuit in which m=n, or, in some cases when m<n, and in other cases, when m>n, if it is ensured in each case that each output of the clock signal supply circuit must drive a substantially identical value of load capacitance.

Figure 2A:
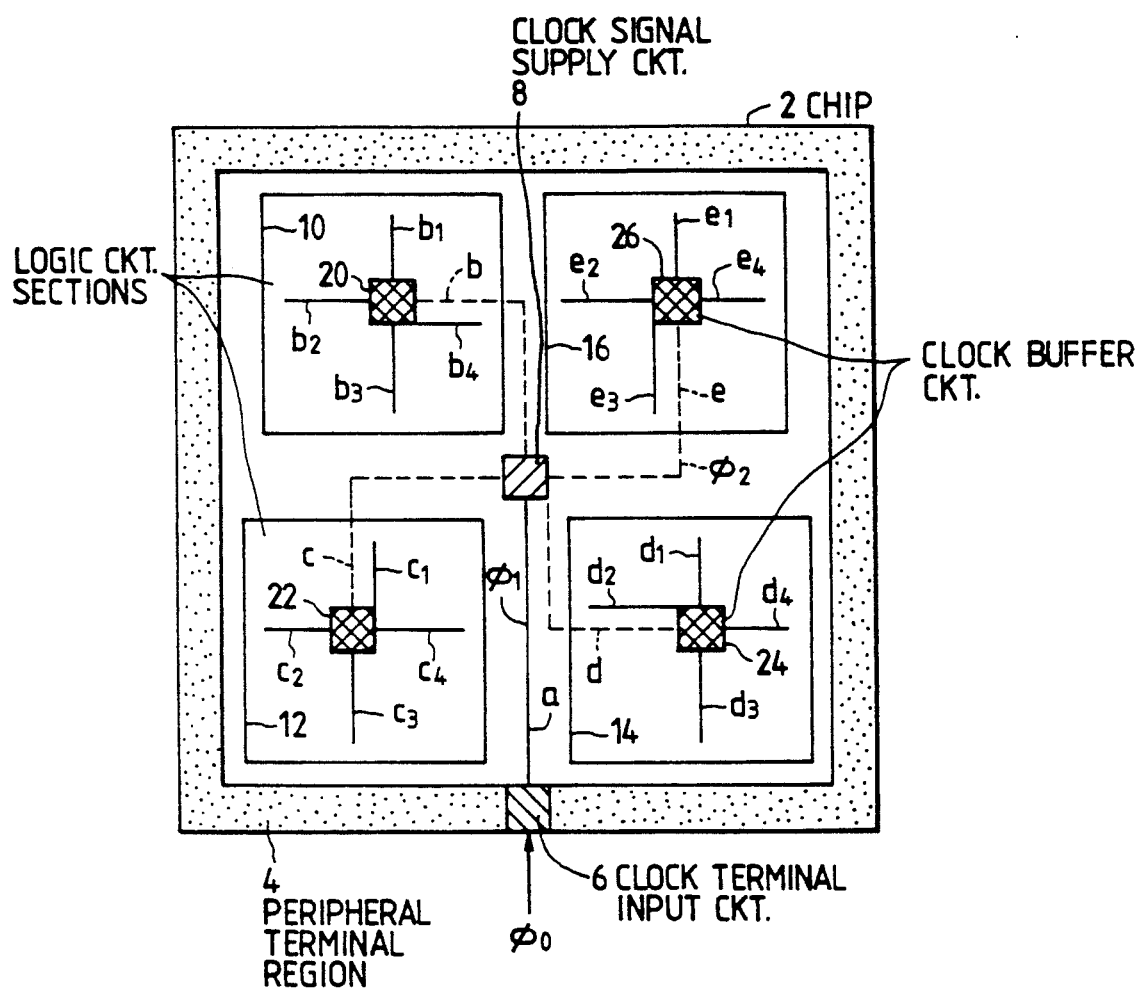
FIG. 2A is a block diagram of a second embodiment of a semiconductor integrated circuit according to the present invention.

FIG. 2A is a block diagram of a second embodiment of a semiconductor integrated circuit according to the present invention, which also shows the respective positions of various circuit blocks of the integrated circuit on the integrated circuit chip. As for FIG. 1A, an integrated circuit chip 2 has a peripherally positioned clock terminal input circuit 6 and a centrally positioned clock signal supply circuit 8, and numerals 10 to 16 denote respective logic circuit sections. However this embodiment differs from the first embodiment with respect to the internal configuration of the clock signal supply circuit 8, and in further being provided with respective clock buffer circuits 20, 22, 24 and 26 for the logic circuit sections 10, 12, 14 and 16. The clock terminal input circuit 6 of this embodiment can be identical to that of the first embodiment described above, for converting an externally supplied clock signal $\phi_0$ to an output clock signal $\phi_1$ that is transferred over a connecting lead a to the clock signal supply circuit 8.

Figure 2B:
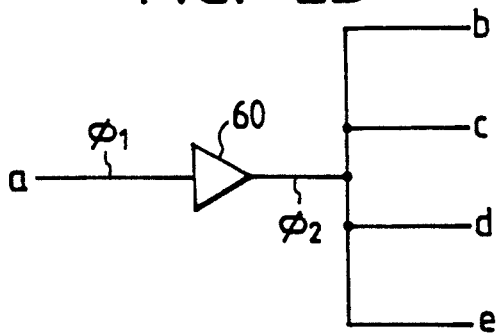
FIG. 2B is a circuit diagram of a clock signal supply circuit in the embodiment of FIG. 2A.

FIG. 2B is a circuit diagram of the clock signal supply circuit 8 of this embodiment. The clock signal $\phi_1$ supplied over connecting lead a is passed through a buffer 60, for waveform shaping, to thereby obtain an output clock signal $\phi_2$ which is supplied to each of connecting leads b, c, d and e to respective clock buffer circuits 20, 22, 24 and 26, which are positioned centrally in respective ones of the of the logic circuit sections 10, 12, 14 and 16.

Figure 2C:
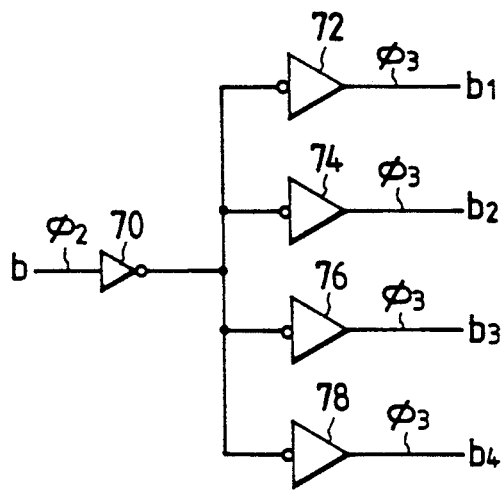
FIG. 2C is a circuit diagram of one of a set of clock buffer circuits in the embodiment of FIG. 2A.

FIG. 2C is a circuit diagram of a specific configuration for the clock buffer circuit 20. The clock signal $\phi_2$, from connecting lead b, is transferred through an inverter 70 to respective inputs of inverter buffers 72, 74, 76 and 78, each of which thereby produces an output clock signal $\phi_3$. The output clock signals from the inverter buffers 72 to 78 are applied to connecting leads $b_1$, $b_2$, $b_3$ and $b_4$, and hence supplied to specific small regions within the logic circuit section 10. The drive capacity required for each of the inverter buffers 72 to 78 is determined in accordance with the amount of load capacitance presented by the the corresponding connecting leads $b_1$ to $b_4$.

It can thus be understood that the clock buffer circuits 20, 22, 24 and 26 shown in FIG. 2A each execute waveform shaping of an input clock signal to produce an output clock signal, which is then supplied over a set of connecting leads $a_i$, $b_i$, $c_i$, $d_i$, (where i is an integer from 1 to 4 in this example) to respective small regions within the corresponding one of the logic circuit sections 10, 12, 14, 16.

Output clock signals from the clock signal supply circuit 8 are supplied over the connecting leads b, c, d and e to respective clock buffer circuits 20, 22, 24 and 26, such that respective path lengths and values of connecting lead capacitance of these connecting leads are substantially identical. As a result, there will be almost no phase deviations between the respective clock signals that are inputted to the clock buffer circuits 20 to 26, and hence the output clock signals produced from each of the clock buffer circuits 20 to 26 will be almost identical in phase to the output clock signals produced from the other clock buffer circuits.

The clock buffer circuit 20 produces clock signals that are distributed in the logic circuit section 10, which is positioned within the upper left-hand region of the chip 2, and supplies the clock signals to specific small regions in the logic circuit section 10 by means of two vertically oriented connecting leads $b_1$, $b_3$ and two horizontally oriented connecting leads $b_2$, $b_4$. Similarly, the clock buffer circuit 22 produces clock signals that are distributed in the logic circuit section 12, which is positioned within the lower left-hand region of the chip 2, and supplies the clock signals to specific small regions in the logic circuit section 12 by means of two vertically oriented connecting leads $c_1$, $c_3$ and two horizontally oriented connecting leads $c_2$, $c_4$.

In addition, the clock buffer circuit 24 produces clock signals that are distributed in the logic circuit section 14, which is positioned within the lower right-hand region of the chip 2, and supplies the clock signals to specific small regions in the logic circuit section 14 by means of two vertically oriented connecting leads $d_1$, $d_3$ and two horizontally oriented connecting leads $d_2$, $d_4$. The clock buffer circuit 26 produces clock signals that are distributed in the logic circuit section 16, which is positioned within the upper right-hand region of the chip 2, and supplies the clock signals to specific small regions in the logic circuit section 16 by means of two vertically oriented connecting leads $e_1$, $e_3$ and two horizontally oriented connecting leads $e_5$, $e_4$.

From FIG. 2A, it can be understood that the logic circuit sections lie within respective regions of the chip 2, and that these regions are defined by a mutually intersecting central horizontal axis and central vertical axis (not shown in the drawings) of the chip area. In each of these regions containing one of the logic circuit sections 10, 12, 14, 16, the clock signal phase within the region varies in accordance with distance from the center of the region. That is, for positions lying along a set of concentric circles which are coaxial with the center of the region, the clock signal phase will be uniform for all positions along any one specific circle, and the phase delay (with respect to the output signals from the clock buffer circuit of that region) will increase in accordance with distance of each circle from the center of the region. This distribution of clock signal phase is identical for each of these regions and hence it can be understood that, for example, the clock signal phase will be virtually identical between mutually adjacent peripheral portions of the logic circuit sections 10, 12, 14, 16. Thus there will be almost no clock skew between the different logic circuit sections.

As a result, it is found that the maximum clock skew that occurs between the logic circuit sections 10 to 16 can be held to a value that is less than $\frac{1}{4}$ of the clock skew that occurs with a prior art integrated circuits in which the clock signal supply circuit is positioned at the periphery of the integrated circuit chip.

In the embodiment of FIG. 2A, the integrated circuit is basically divided into four regions, which are defined as stated above by mutually intersecting horizontal and vertical central axes of the area of the chip 2. However it would be equally possible to establish these four regions by dividing the chip 2 by two lines extending between respective pairs of opposing corners of the chip 2. Furthermore similar results to those described above for the case in which the integrated circuit chip is divided into four regions can in general be achieved by dividing the chip area into n regions, where n is an integer greater than one, with a clock buffer circuit being provided at the center of each of the regions, and with a clock signal being supplied to each of the clock buffer circuits from a clock signal supply circuit which is positioned at the center of the chip, so long as it is ensured that the connecting lead capacitance values presented to the clock signal supply circuit by connecting leads for supplying the respective clock buffer circuits are substantially mutually identical, and that the connecting lead capacitance values presented to each of the clock buffer circuits by connecting leads for supplying respective small regions within the corresponding region are substantially mutually identical.

Figure 3:
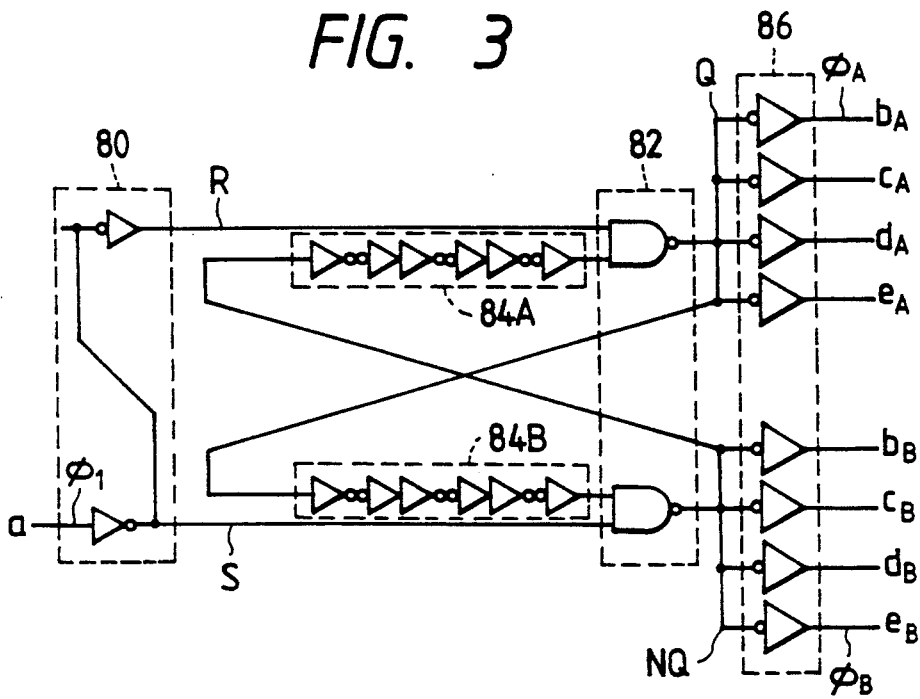
FIG. 3 is a circuit diagram of a clock signal supply circuit for producing a 2-phase non-overlap clock signal, for use in the first or the second embodiment.

The above embodiments have been described for the case of a single phase clock signal being used. However the present invention is equally applicable to a multiphase clock signal. In particular, in the case of a 2-phase non-overlap clock signal, it is essential to ensure that the non-overlap period of the clock signal is held uniform for all of the regions of an integrated circuit that receive the clock signal. The present invention is extremely effective in such an application. FIG. 3 is a circuit diagram of a specific configuration for the clock signal supply circuit 8, for the case in which a 2-phase non-overlap clock signal is produced from the clock signal supply circuit 8. Numeral 80 denotes an input buffer circuit, 82 denotes an RS flip-flop, 84A and 84B denote respective delay circuits, and 86 denotes two sets of four inverter buffers, with one set of inverter buffers being coupled to receive an output signal from the Q output of the RS flip-flop 82 and producing four clock signal outputs (of clock signal phase $\phi_A$), i.e. $b_A$, $c_A$, $d_A$ and $e_A$, and the other set of four inverter buffers receiving the output signal from the NQ output of the flip-flop, and producing four clock signal outputs (of clock signal phase $\phi_B$), i.e. $b_B$, $c_B$, $d_B$ and $e_B$. The clock signal $\phi_1$ supplied over connecting lead a is applied to the input buffer circuit 80. Thus when clock signal $\phi_1$ is at the H logic level, the "reset" input line R of the RS flip-flop 82 goes to the H state while the "set" input line S goes to the L level. Thus, the outputs Q and NQ of the RS flip-flop 82 go to the L and the H levels respectively. In this condition, the output clock signal phase $\phi_A$ (i.e. the outputs of the set of four inverter buffers that are connected to the Q output of the RS flip-flop 82) goes to the H level, while the clock signal phase $\phi_B$ (i.e. the outputs $b_B$, $c_B$, $d_B$, $e_B$ of the set of four inverter buffers that are connected to the NQ output of the RS flip-flop 82) goes to the L level. When the input clock signal $\phi_1$ changes from the H to the L level, the R input line of the RS flip-flop 82 goes from the H to the L level, and the S input line goes from the L to the H level. As a result, the Q output of the RS flip-flop 82 goes from the L to the H level, while the NQ output of the RS flip-flop 82 goes from the H to the L level after a time delay that is determined by the delay circuit 84B following the point in time at which the Q output of the RS flip-flop 82 reaches the H level. The output clock signal phase $\phi_A$ (obtained by inverting the Q output from the RS flip-flop 82) thus changes from the H to the L level at that point in time, while the output clock signal phase $\phi_B$ changes from the L to the H level after the time delay that is determined by the delay circuit 84B, following the point in time at which the clock signal phase $\phi_A$ reaches the L level.

When the input clock signal $\phi_1$ changes from the L to the H level, the S input line goes from the H to the L level. As a result, the NQ output of the RS flip-flop 82 goes from the L to the H level, and the Q output of the RS flip-flop 82 goes from the H to the L level after a time delay that is determined by the delay circuit 84A, following the point in time at which the NQ output of the RS flip-flop 82 reaches the H level. The output clock signal phase $\phi_B$ thus changes from the H to the L level at that point in time, while the output clock signal phase $\phi_A$ changes from the L to the H level after the time delay that is determined by the delay circuit 84A, following the point in time at which the clock signal phase $\phi_B$ reaches the L level.

Thus, the clock signal phases $\phi_A$ and $\phi_B$ are generated with a non-overlap period whose value is determined by the delay times of the delay circuits 84A, 84B.

In the first and second embodiments of the invention described above, the respective paths of the connecting leads used for clock signal distribution are formed as portions of a rectangular grid, as will be apparent from FIGS. 1A and 2A. This is true of both the connecting leads (b, c, d, e) from the clock signal supply circuit 8 and the leads ($b_1$, $b_2$, etc.) extending from the clock buffer circuits 20 to 26 in FIG. 2A. However it should be noted that it would be equally possible to arrange these connecting lead paths to extend radially outward from the clock signal supply circuit and from each of the clock buffer circuits.

As can be understood from the above description, the present invention enables a clock signal to be distributed within various regions of a VLSI such that the degree of clock skew between different sections of the integrated circuit can be made negligibly small, even if a high value of clock frequency is used. Operating errors resulting from clock skew can thereby be eliminated.

What is claimed is:

1. In a semiconductor integrated circuit formed on an integrated circuit chip, the semiconductor integrated circuit comprising clock signal supply means for producing a plurality of multi-phased clock signals, said plurality of clock signals having respectively different phases from each other, and a plurality of logic circuit sections coupled to receive the differently phased clock signals from the clock signal supply means, the improvement wherein:

the logic circuit sections are disposed in respective outer regions of the chip which are respectively positioned peripherally outwardly from a central region of the chip, the clock signal supply means comprises a single clock input terminal situated peripherally on the integrated circuit chip and coupled to receive only a single externally supplied input clock signal, waveform shaping means for operating on said input clock signal to produce an output clock signal having a predetermined waveform, and clock signal generating circuit means responsive to said output clock signal from said waveform shaping means for producing said plurality of multi-phased clock signals having different phases from each other, and the semiconductor integrated circuit further comprises respective clock buffer means disposed in each of the outer regions, each of the outer regions comprising connecting lead means for supplying an output clock signal produced from the corresponding clock buffer means to the logic circuit section of that outer region.

2. A semiconductor integrated circuit as recited in claim 1, comprising four logic circuit sections, wherein said logic circuit sections are disposed in respective ones of four outer regions of the chip.

3. A semiconductor integrated circuit as recited in claim 1, wherein said clock signal supply means is situated substantially in a central region of the integrated circuit chip and said respective clock buffer means are disposed substantially centrally in each of the outer regions.

4. A semiconductor integrated circuit as recited in claim 3, wherein said waveform shaping means comprises frequency dividing means for producing an output clock signal having a predetermined waveform and a frequency obtained by dividing a frequency of said single externally supplied input clock signal.

5. A semiconductor integrated circuit as recited in claim 1, wherein said waveform shaping means comprises frequency dividing means for producing an output clock signal having a predetermined waveform and a frequency obtained by dividing a frequency of said single externally supplied input clock signal.

6. In a semiconductor integrated circuit formed on an integrated circuit chip, the semiconductor integrated circuit comprising clock signal supply means for producing a plurality of multi-frequency clock signals, said plurality of clock signals having respectively different frequencies from each other, and a plurality of logic circuit sections coupled to receive the different frequency clock signals from the clock signal supply means, the improvement wherein:

the logic circuit sections are disposed in respective outer regions of the chip which are respectively positioned peripherally outwardly from a central region of the chip, the clock signal supply means comprises a single clock input terminal situated peripherally on the integrated circuit chip and coupled to receive only a single externally supplied input clock signal, waveform shaping means for operating on said input clock signal to produce an output clock signal having a predetermined waveform, and clock signal generating circuit means responsive to said output clock signal from said waveform shaping means for producing said multi-frequency clock signals having different phases from each other, and the semiconductor integrated circuit further comprises respective clock buffer means disposed in each of the outer regions, each of the outer regions comprising connecting lead means for supplying an output clock signal produced from the corresponding clock buffer means to the logic circuit section of that outer region.

7. A semiconductor integrated circuit as recited in claim 6, comprising four logic circuit sections, wherein said logic circuit sections are disposed in respective ones of four outer regions of the chip.

8. A semiconductor integrated circuit as recited in claim 6, wherein said clock signal supply means is situated substantially in a central region of the integrated circuit chip and said respective clock buffer means are disposed substantially centrally in each of the outer regions.

9. A semiconductor integrated circuit as recited in claim 8, wherein said waveform shaping means comprises frequency dividing means for producing an output clock signal having a predetermined waveform and a frequency obtained by dividing a frequency of said single externally supplied input clock signal.

10. A semiconductor integrated circuit as recited in claim 6, wherein said waveform shaping means comprises frequency dividing means for producing an output clock signal having a predetermined waveform and a frequency obtained by dividing a frequency of said single externally supplied input clock signal.

11. In a semiconductor integrated circuit formed on an integrated circuit chip, the semiconductor integrated circuit comprising clock signal supply means for producing a plurality of clock signals, and a plurality of logic circuit sections each including a plurality of coupled logic circuit elements receiving the clock signals from the block signal supply means, the improvement wherein:

the chip is divided into n outer regions, where n is an integer greater than one, said regions respectively positioned peripherally outwardly from a central region of the chip, said logic circuit sections being respectively disposed within said n outer regions, and the clock signal supply means comprises a single clock input terminal situated peripherally on the integrated circuit chip and coupled to receive only a single externally supplied input clock signal, waveform shaping means for operating on said input clock signal to produce an output clock signal having a predetermined waveform, and clock signal generating circuit means responsive to said output clock signal from said waveform shaping means for producing said plurality of clock signals, said waveform shaping means comprising frequency dividing means for producing an output clock signal having a predetermined waveform and a frequency obtained by dividing a frequency of said single, externally supplied input clock signal, and wherein the semiconductor integrated circuit further comprises respective clock buffer means disposed in each of the outer regions, each of the outer regions comprising connecting lead means for supplying output clock signals from the corresponding clock buffer means to the plurality of logic circuit elements of the logic circuit section of that outer region, whereby clock signals sent to different ones of said plurality of logic elements in said plurality of logic circuit sections are substantially free from clock skew resulting from difference in connection lead lengths.

12. A semiconductor integrated circuit as recited in claim 11, comprising four logic circuit sections, wherein said logic circuit sections are disposed in respective ones of four outer regions of the chip.

13. A semiconductor integrated circuit as recited in claim 11, wherein said clock signal supply means is situated substantially in a central region of the integrated circuit chip and said respective clock buffer means are disposed substantially centrally in each of the outer regions.

14. A semiconductor integrated circuit as recited in claim 13, wherein said clock signal supply means comprises means for producing a plurality of multi-frequency clock signals, said plurality of clock signals having respectively different frequencies from each other.

15. A semiconductor integrated circuit as recited in claim 11, wherein said clock signal supply means comprises means for producing a plurality of multi-frequency clock signals, said plurality of clock signals having respectively different frequencies from each other.

* * * * *